(12) United States Patent
Busser

(10) Patent No.: US 10,948,543 B2
(45) Date of Patent: Mar. 16, 2021

(54) SYSTEM FOR DETERMINING A DISCHARGE POWER LIMIT VALUE AND A CHARGE POWER LIMIT VALUE OF A BATTERY CELL

(71) Applicant: LG Chem, Ltd., Seoul (KR)

(72) Inventor: Robert Dale Busser, West Bloomfield, MI (US)

(73) Assignee: LG Chem, Ltd., Seoul (KR)

(*) Notice: Subject to any disclaimer, the term of this patent is extended or adjusted under 35 U.S.C. 154(b) by 202 days.

(21) Appl. No.: 16/258,866

(22) Filed: Jan. 28, 2019

(65) Prior Publication Data

US 2020/0241074 A1    Jul. 30, 2020

(51) Int. Cl.
*G01R 31/36* (2020.01)
*G01R 31/396* (2019.01)
*G01R 31/367* (2019.01)

(52) U.S. Cl.
CPC ....... *G01R 31/3648* (2013.01); *G01R 31/367* (2019.01); *G01R 31/396* (2019.01)

(58) Field of Classification Search
CPC .......................... G01R 31/3648; G01R 31/396
USPC ......................................................... 702/63
See application file for complete search history.

(56) References Cited

U.S. PATENT DOCUMENTS

| | | | |
|---|---|---|---|
| 7,564,221 B2 | 7/2009 | Asai et al. | |
| 8,655,524 B2* | 2/2014 | Ichikawa | B60L 58/24 701/22 |
| 9,921,272 B2 | 3/2018 | Busser | |
| 2005/0077867 A1* | 4/2005 | Cawthorne | B60K 6/445 320/104 |
| 2005/0099154 A1* | 5/2005 | Ohnuma | B60L 58/16 320/107 |
| 2015/0239364 A1* | 8/2015 | Baughman | B60L 3/0046 701/33.4 |
| 2016/0023568 A1* | 1/2016 | Lee | B60L 58/12 429/50 |
| 2016/0187429 A1 | 6/2016 | Kawai et al. | |
| 2017/0187203 A1* | 6/2017 | Ikeda | H01M 10/446 |
| 2017/0336479 A1* | 11/2017 | Busser | G01R 31/3648 |
| 2019/0143820 A1* | 5/2019 | Ying | B60L 50/51 307/10.6 |

* cited by examiner

*Primary Examiner* — Ricky Ngon
*Assistant Examiner* — Ricky Go
(74) *Attorney, Agent, or Firm* — Buckert Patent & Trademark Law Firm PC; John F. Buckert

(57) ABSTRACT

A system for determining a discharge power limit value of a battery cell is provided. A microprocessor calculates an adjusted maximum allowed voltage drop value based on a maximum allowed voltage drop value, and an estimated delta OCV value at N seconds after a first time. The estimated delta OCV value is calculated based on a first discharge current level. The microprocessor calculates a second discharge current level through the battery cell for N seconds to obtain the adjusted maximum allowed voltage drop value. The microprocessor calculates a discharge power limit value based on the second discharge current level that indicates an amount of power from the battery cell for N seconds without the voltage across the battery cell falling below a minimum allowed voltage of the battery cell.

20 Claims, 12 Drawing Sheets

R0 DISCHARGE TABLE (2 SECONDS)

|  | SOC1 | SOC2 | SOC3 |
|---|---|---|---|
| TEMP1 | R0_1 | R0_2 | R0_3 |
| TEMP2 | R0_4 | R0_5 | R0_6 |
| TEMP3 | R0_7 | R0_8 | R0_9 |

R1 DISCHARGE TABLE (2 SECONDS)

|  | SOC1 | SOC2 | SOC3 |
|---|---|---|---|
| TEMP1 | R1_1 | R1_2 | R1_3 |
| TEMP2 | R1_4 | R1_5 | R1_6 |
| TEMP3 | R1_7 | R1_8 | R1_9 |

R2 DISCHARGE TABLE (2 SECONDS)

|  | SOC1 | SOC2 | SOC3 |
|---|---|---|---|
| TEMP1 | R2_1 | R2_2 | R2_3 |
| TEMP2 | R2_4 | R2_5 | R2_6 |
| TEMP3 | R2_7 | R2_8 | R2_9 |

R3 DISCHARGE TABLE (2 SECONDS)

|  | SOC1 | SOC2 | SOC3 |
|---|---|---|---|
| TEMP1 | R3_1 | R3_2 | R3_3 |
| TEMP2 | R3_4 | R3_5 | R3_6 |
| TEMP3 | R3_7 | R3_8 | R3_9 |

R1C1 DISCHARGE TABLE (2 SECONDS)

|  | SOC1 | SOC2 | SOC3 |
|---|---|---|---|
| TEMP1 | R1C1_1 | R1C1_2 | R1C1_3 |
| TEMP2 | R1C1_4 | R1C1_5 | R1C1_6 |
| TEMP3 | R1C1_7 | R1C1_8 | R1C1_9 |

R2C2 DISCHARGE TABLE (2 SECONDS)

|  | SOC1 | SOC2 | SOC3 |
|---|---|---|---|
| TEMP1 | R2C2_1 | R2C2_2 | R2C2_3 |
| TEMP2 | R2C2_4 | R2C2_5 | R2C2_6 |
| TEMP3 | R2C2_7 | R2C2_8 | R2C2_9 |

R3C3 DISCHARGE TABLE (2 SECONDS)

|  | SOC1 | SOC2 | SOC3 |
|---|---|---|---|
| TEMP1 | R3C3_1 | R3C3_2 | R3C3_3 |
| TEMP2 | R3C3_4 | R3C3_5 | R3C3_6 |
| TEMP3 | R3C3_7 | R3C3_8 | R3C3_9 |

R0 CHARGE TABLE (2 SECONDS)

|  | SOC1 | SOC2 | SOC3 |
|---|---|---|---|
| TEMP1 | R0_1 | R0_2 | R0_3 |
| TEMP2 | R0_4 | R0_5 | R0_6 |
| TEMP3 | R0_7 | R0_8 | R0_9 |

R1 CHARGE TABLE (2 SECONDS)

|  | SOC1 | SOC2 | SOC3 |
|---|---|---|---|
| TEMP1 | R1_1 | R1_2 | R1_3 |
| TEMP2 | R1_4 | R1_5 | R1_6 |
| TEMP3 | R1_7 | R1_8 | R1_9 |

R2 CHARGE TABLE (2 SECONDS)

|  | SOC1 | SOC2 | SOC3 |
|---|---|---|---|
| TEMP1 | R2_1 | R2_2 | R2_3 |
| TEMP2 | R2_4 | R2_5 | R2_6 |
| TEMP3 | R2_7 | R2_8 | R2_9 |

R3 CHARGE TABLE (2 SECONDS)

|  | SOC1 | SOC2 | SOC3 |
|---|---|---|---|
| TEMP1 | R3_1 | R3_2 | R3_3 |
| TEMP2 | R3_4 | R3_5 | R3_6 |
| TEMP3 | R3_7 | R3_8 | R3_9 |

R1C1 CHARGE TABLE (2 SECONDS)

|  | SOC1 | SOC2 | SOC3 |
|---|---|---|---|
| TEMP1 | R1C1_1 | R1C1_2 | R1C1_3 |
| TEMP2 | R1C1_4 | R1C1_5 | R1C1_6 |
| TEMP3 | R1C1_7 | R1C1_8 | R1C1_9 |

R2C2 CHARGE TABLE (2 SECONDS)

|  | SOC1 | SOC2 | SOC3 |
|---|---|---|---|
| TEMP1 | R2C2_1 | R2C2_2 | R2C2_3 |
| TEMP2 | R2C2_4 | R2C2_5 | R2C2_6 |
| TEMP3 | R2C2_7 | R2C2_8 | R2C2_9 |

R3C3 CHARGE TABLE (2 SECONDS)

|  | SOC1 | SOC2 | SOC3 |
|---|---|---|---|
| TEMP1 | R3C3_1 | R3C3_2 | R3C3_3 |
| TEMP2 | R3C3_4 | R3C3_5 | R3C3_6 |
| TEMP3 | R3C3_7 | R3C3_8 | R3C3_9 |

SOC_TO_OCV_TABLELOOKUP

| SOC 1 | OCV 1 |
|---|---|
| SOC 2 | OCV 2 |
| SOC 3 | OCV 3 |

750 — MICROPROCESSOR CALCULATES THE DISCHARGE POWER LIMIT VALUE (DISCHARGE_POWER_LIMIT) THAT INDICATES AN AMOUNT OF POWER THAT CAN BE EXPECTED FROM THE BATTERY CELL CONTINUOUSLY FOR N SECONDS AFTER THE FIRST TIME WITHOUT EXCEEDING I_MAX_ALLOWED_DISCHARGE CURRENT UTILIZING THE FOLLOWING EQUATION:
DISCHARGE_POWER_LIMIT = I_MAX_ALLOWED_DISCHARGE_CURRENT * (VCELL - I_MAX_ALLOWED_DISCHARGE_CURRENT * (R0 + (R1 + R2 + R3) * PREDICTIVE_SATURATION_RATIO_VALUE))
WHEREIN
PREDICTIVE_SATURATION_RATIO_VALUE =

$$\frac{R1\left(1-e^{\left(\frac{-Nsec}{R1C1}\right)}\right)+R2\left(1-e^{\left(\frac{-Nsec}{R2C2}\right)}\right)+R3\left(1-e^{\left(\frac{-Nsec}{R3C3}\right)}\right)}{R1+R2+R3}$$

752 — MICROPROCESSOR STORES THE DISCHARGE POWER LIMIT VALUE (DISCHARGE_POWER_LIMIT) IN THE MEMORY DEVICE (E)

754 — MICROPROCESSOR CALCULATES A MAXIMUM ALLOWED VOLTAGE RISE VALUE (MAXIMUM_ALLOWED_VOLTAGE_RISE) CORRESPONDING TO A DIFFERENCE BETWEEN A VOLTAGE MEASURED ACROSS THE BATTERY CELL AT THE FIRST TIME (VCELL) AND A MAXIMUM ALLOWED VOLTAGE MEASURED ACROSS THE BATTERY CELL (VMAX_ALLOWED) AT ANY TIME UTILIZING THE FOLLOWING EQUATION:
MAXIMUM_ALLOWED_VOLTAGE_RISE = VMAX_ALLOWED - VCELL (F)

SYSTEM FOR DETERMINING A DISCHARGE POWER LIMIT VALUE AND A CHARGE POWER LIMIT VALUE OF A BATTERY CELL

BACKGROUND

A known system for determining power limits of a battery cell does not consider a change in the state-of-charge (SOC) and an associated change in an open circuit voltage (OCV) in the battery cell during either a discharge current for N seconds or a charge current for N seconds. The inventor herein has recognized that more accurate calculations for power limits of a battery cell can be obtained by considering the change in the SOC and the change in the OCV of the battery cell during either a discharge current or a charge current for N seconds.

SUMMARY

A system for determining a discharge power limit value of a battery cell in accordance with an exemplary embodiment is provided. The system includes a current sensor generating a first signal having a first current value therein indicating a current level flowing through the battery cell at a first time. The system further includes a microprocessor that calculates a maximum allowed voltage drop value corresponding to a difference between a voltage measured across the battery cell at the first time and a minimum allowed voltage of the battery cell. The microprocessor calculates a first discharge current level through the battery cell for N seconds after the first time to obtain the maximum allowed voltage drop value, based on the first current value. The microprocessor calculates an adjusted maximum allowed voltage drop value based on the maximum allowed voltage drop value, and an estimated delta OCV value at N seconds after the first time. The estimated delta OCV value is calculated based on the first discharge current level. The microprocessor calculates a second discharge current level through the battery cell for N seconds after the first time to obtain the adjusted maximum allowed voltage drop value. The microprocessor calculates a discharge power limit value based on the second discharge current level, if the second discharge current level is less than or equal to a maximum allowed discharge current.

A system for determining a charge power limit value of a battery cell in accordance with another exemplary embodiment is provided. The system includes a current sensor generating a first signal having a first current value therein indicating a current level flowing through the battery cell at a first time. The system further includes a microprocessor that calculates a maximum allowed voltage rise value corresponding to a difference between a voltage measured across the battery cell at the first time and a maximum allowed voltage of the battery cell. The microprocessor calculates a first charge current level through the battery cell for N seconds after the first time to obtain the maximum allowed voltage rise value, based on the first current value. The microprocessor calculates an adjusted maximum allowed voltage rise value based on the maximum allowed voltage rise value, and an estimated delta OCV value at N seconds after the first time. The estimated delta OCV value is calculated based on the first charge current level. The microprocessor calculates a second charge current level through the battery cell for N seconds after the first time to obtain the adjusted maximum allowed voltage rise value. The microprocessor calculates a charge power limit value based on the second charge current level, if the second charge current level is less than or equal to a maximum allowed charge current.

BRIEF DESCRIPTION OF THE DRAWINGS

FIG. 4 is an R0 discharge table having resistance values of a first resistor in the battery cell equivalent circuit model of FIG. 2 when discharging the battery cell—utilized for determining a discharge power limit value;

FIG. 5 is an R1 discharge table having resistance values of a second resistor in the battery cell equivalent circuit model of FIG. 2 when discharging the battery cell—utilized for determining a discharge power limit value;

FIG. 6 is an R2 discharge table having resistance values of a third resistor in the battery cell equivalent circuit model of FIG. 2 when discharging the battery cell—utilized for determining a discharge power limit value;

FIG. 7 is an R3 discharge table having resistance values of a fourth resistor in the battery cell equivalent circuit model of FIG. 2 when discharging the battery cell—utilized for determining a discharge power limit value;

FIG. 8 is an R1C1 discharge table having time constant values of a parallel combination of the second resistor and the first capacitor in the battery cell equivalent circuit model of FIG. 2 when discharging the battery cell—utilized for determining a discharge power limit value;

FIG. 9 is an R2C2 discharge table having time constant values of a parallel combination of the third resistor and the second capacitor in the battery cell equivalent circuit model of FIG. 2 when discharging the battery cell—utilized for determining a discharge power limit value;

FIG. 10 is an R3C3 discharge table having time constant values of a parallel combination of the fourth resistor and the third capacitor in the battery cell equivalent circuit model of FIG. 2 when discharging the battery cell—utilized for determining a discharge power limit value;

FIG. 11 is an R0 charge table having resistance values of the first resistor in the battery cell equivalent circuit model of FIG. 2 when charging the battery cell—utilized for determining a charge power limit value;

FIG. 12 is an R1 charge table having resistance values of a second resistor in the battery cell equivalent circuit model of FIG. 2 when charging the battery cell—utilized for determining a charge power limit value;

FIG. 13 is an R2 charge table having resistance values of a third resistor in the battery cell equivalent circuit model of FIG. 2 when charging the battery cell—utilized for determining a charge power limit value;

FIG. 14 is an R3 charge table having resistance values of a fourth resistor in the battery cell equivalent circuit model of FIG. 2 when charging the battery cell—utilized for determining a charge power limit value;

FIG. 15 is an R1C1 charge table having time constant values of a parallel combination of the second resistor and the first capacitor in the battery cell equivalent circuit model of FIG. 2 when charging the battery cell—utilized for determining a charge power limit value;

FIG. 16 is an R2C2 charge table having time constant values of a parallel combination of the third resistor and the second capacitor in the battery cell equivalent circuit model of FIG. 2 when charging the battery cell—utilized for determining a charge power limit value;

FIG. 17 is an R3C3 charge table having time constant values of a parallel combination of the fourth resistor and the third capacitor in the battery cell equivalent circuit model of FIG. 2 when charging the battery cell—utilized for determining a charge power limit value;

FIG. 18 is a table having SOC values and associated OCV values for a battery cell; and FIGS. 19-27 are a flowchart of a method for determining a discharge power limit value and a charge power limit value of a battery cell in accordance with another exemplary embodiment.

DETAILED DESCRIPTION

Figure 1:
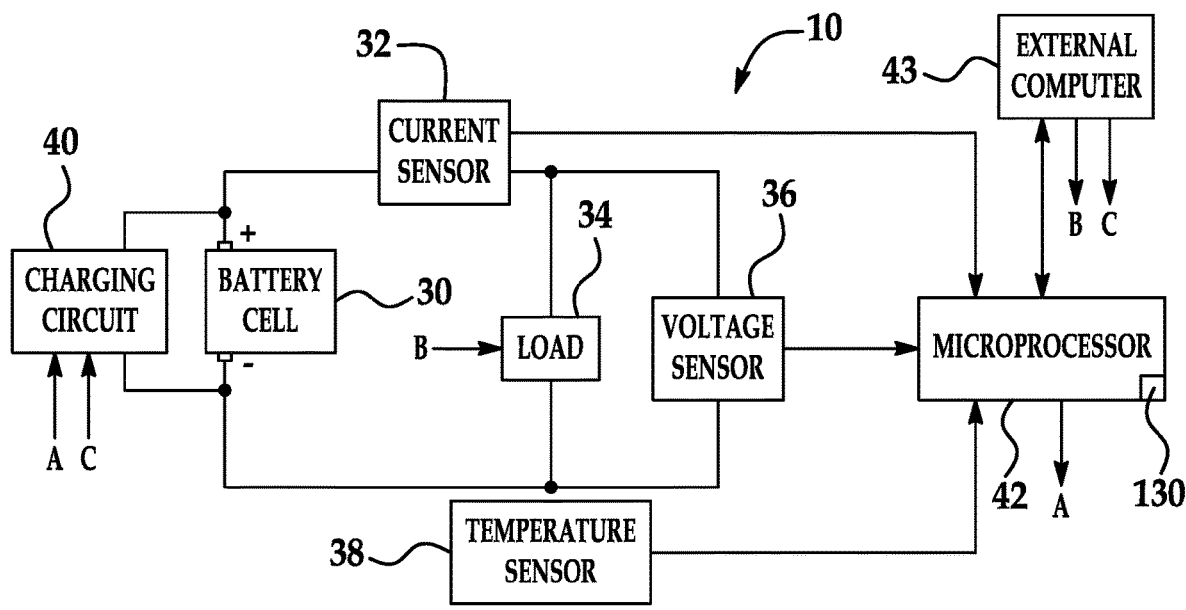
FIG. 1 is a schematic of a system for determining a discharge power limit value and a charge power limit value of a battery cell in accordance with an exemplary embodiment.

Referring to FIG. 1, a system 10 for determining a discharge power limit value of a battery cell 30, and a charge power limit value of the battery cell 30 in accordance with an exemplary embodiment is provided. The system 10 includes a battery cell 30, a current sensor 32, an electrical load 34, a voltage sensor 36, a temperature sensor 38, a charging circuit 40, a microprocessor 42, and an external computer 43.

An advantage of the system 10 is that the system 10 determines a change in the OCV (e.g., delta OCV value) in the battery cell 30 to determine a discharge power limit value that indicates an amount of power that is expected from the battery cell 30 continuously for N seconds after a first time without the voltage measured across the battery cell 30 falling below a minimum allowed voltage of the battery cell 30.

Another advantage of the system 10 is that the system 10 determines a change in the OCV in the battery cell 30 to determine a charge power limit value that indicates an amount of power that is pushed into the battery cell continuously for N seconds after the first time without the voltage measured across the battery cell 30 exceeding the maximum allowed voltage of the battery cell 30.

Figure 2:
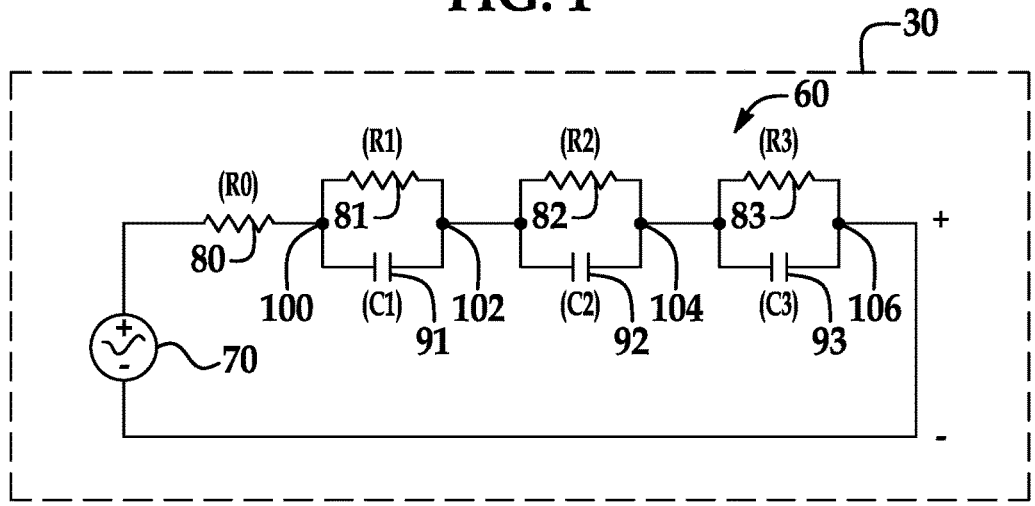
FIG. 2 is a schematic of a battery cell equivalent circuit model associated with a battery cell utilized in the system of FIG. 1.

Referring to FIGS. 1 and 2, the battery cell 30 includes a positive terminal (+) and a negative terminal (−). In an exemplary embodiment, the battery cell 30 is a pouch-type lithium-ion battery cell. Of course, in an alternative embodiment, other types of battery cells could be utilized. The battery cell 30 is mathematically modeled utilizing the battery cell equivalent circuit model 60 having a voltage source 70, resistors 80, 81, 82, 83, capacitors 91, 92, 93, and electrical nodes 100, 102, 104, 106.

The resistor 80 is coupled between the voltage source 70 and the electrical node 100. The resistor 81 and the capacitor 91 are electrically coupled parallel to one another between the electrical nodes 100, 102. The resistor 82 and the capacitor 92 are electrically coupled parallel to one another between the electrical nodes 102, 104. The resistor 83 and the capacitor 93 are electrically coupled parallel to one another between the electrical nodes 104, 106. The electrical node 106 is further coupled to the voltage source 70.

The resistor 80 has a resistance value R0 corresponding to an internal ohmic resistance value of the battery cell 30. The resistor 81 has a resistance value R1 corresponding to a first time-varying resistance value of the battery cell 30. The resistor 82 has a resistance value R2 corresponding to a second time-varying resistance value of the battery cell 30. The resistor 83 has a resistance value R3 corresponding to a third time-varying resistance value of the battery cell 30. The capacitor 91 has a capacitance value C1 corresponding to a first time-varying capacitance of the battery cell 30. The capacitor 92 has a capacitance value C2 corresponding to a second time-varying capacitance of the battery cell 30. The capacitor 93 has a capacitance value C3 corresponding to a third time-varying capacitance of the battery cell 30. The total steady state resistance of the battery cell equivalent circuit model 60 is R0+R1+R2+R3.

Figure 3:
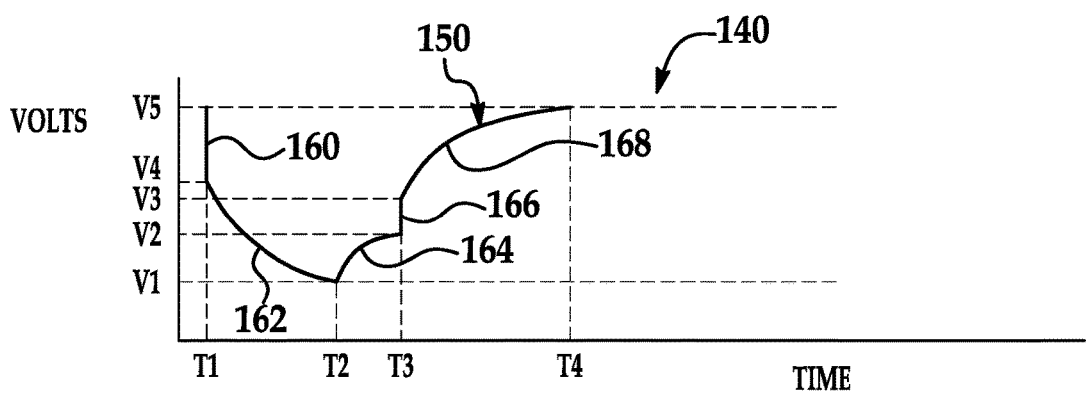
FIG. 3 is a graph of a voltage curve associated with the battery cell utilized in the system of FIG. 1 illustrating first and second discharge curve portions, a relaxation curve portion, and first and second charge curve portions.
Figure 19:
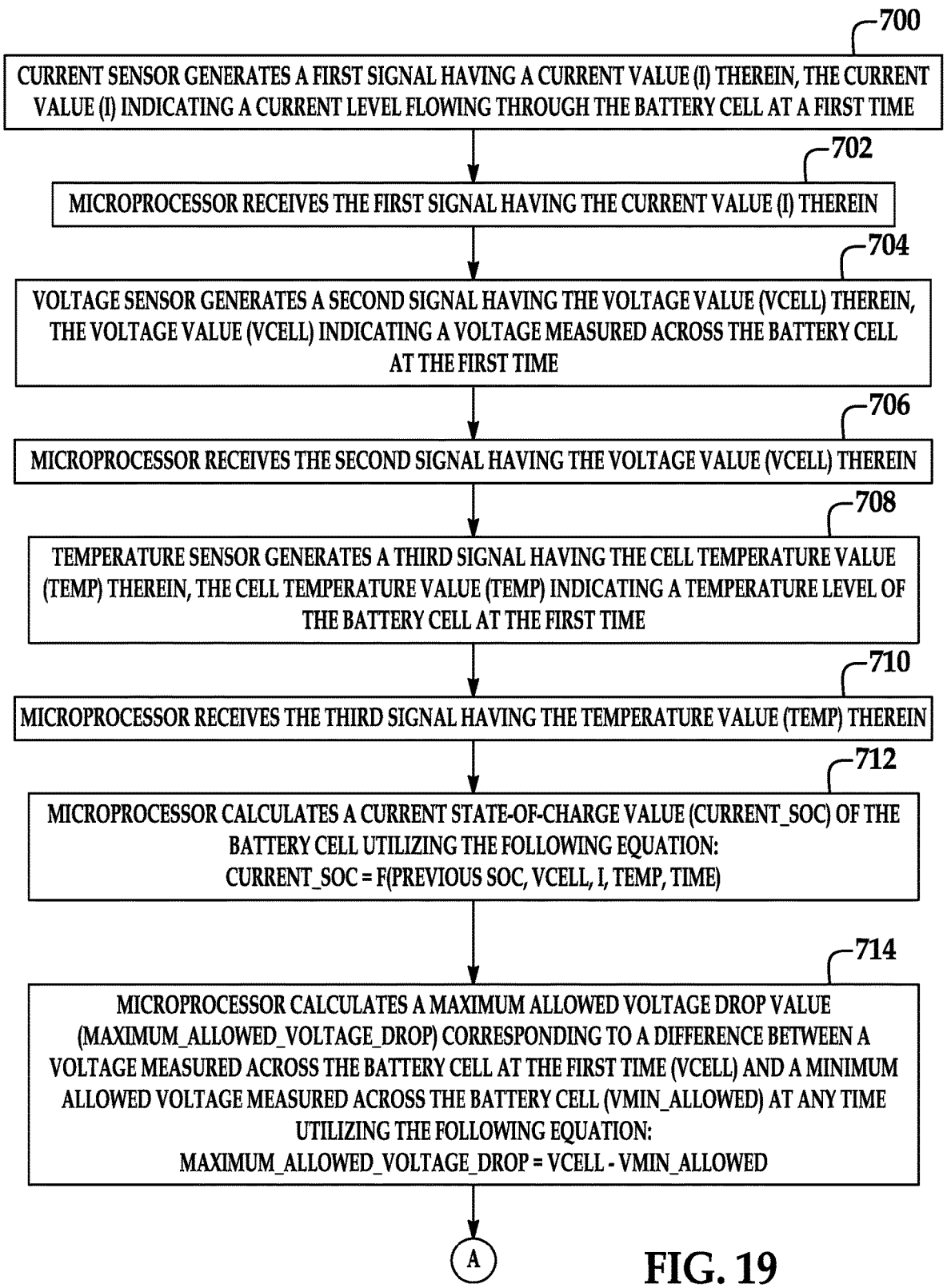
Figure 20:
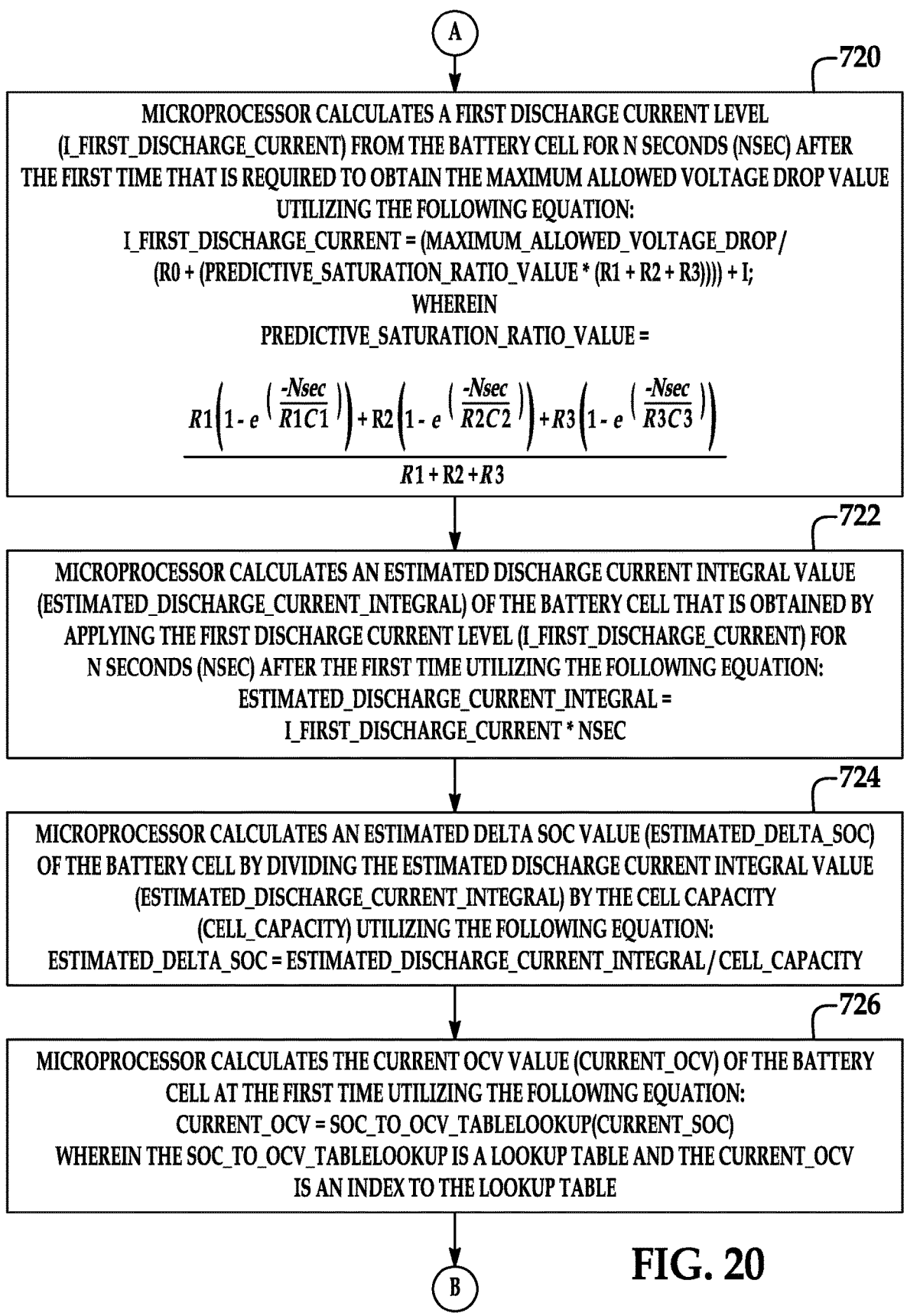
Figure 21:
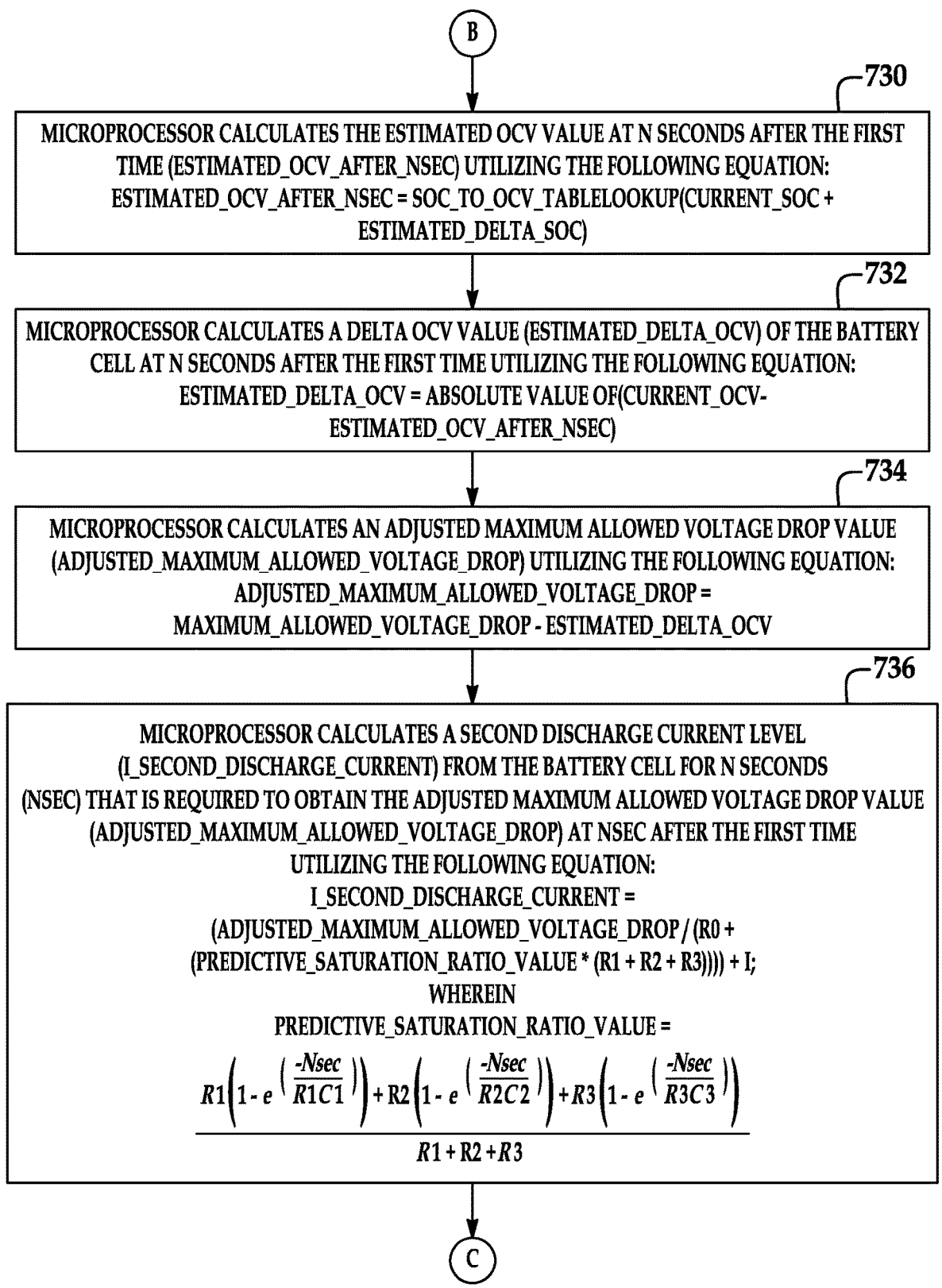
Figure 22:
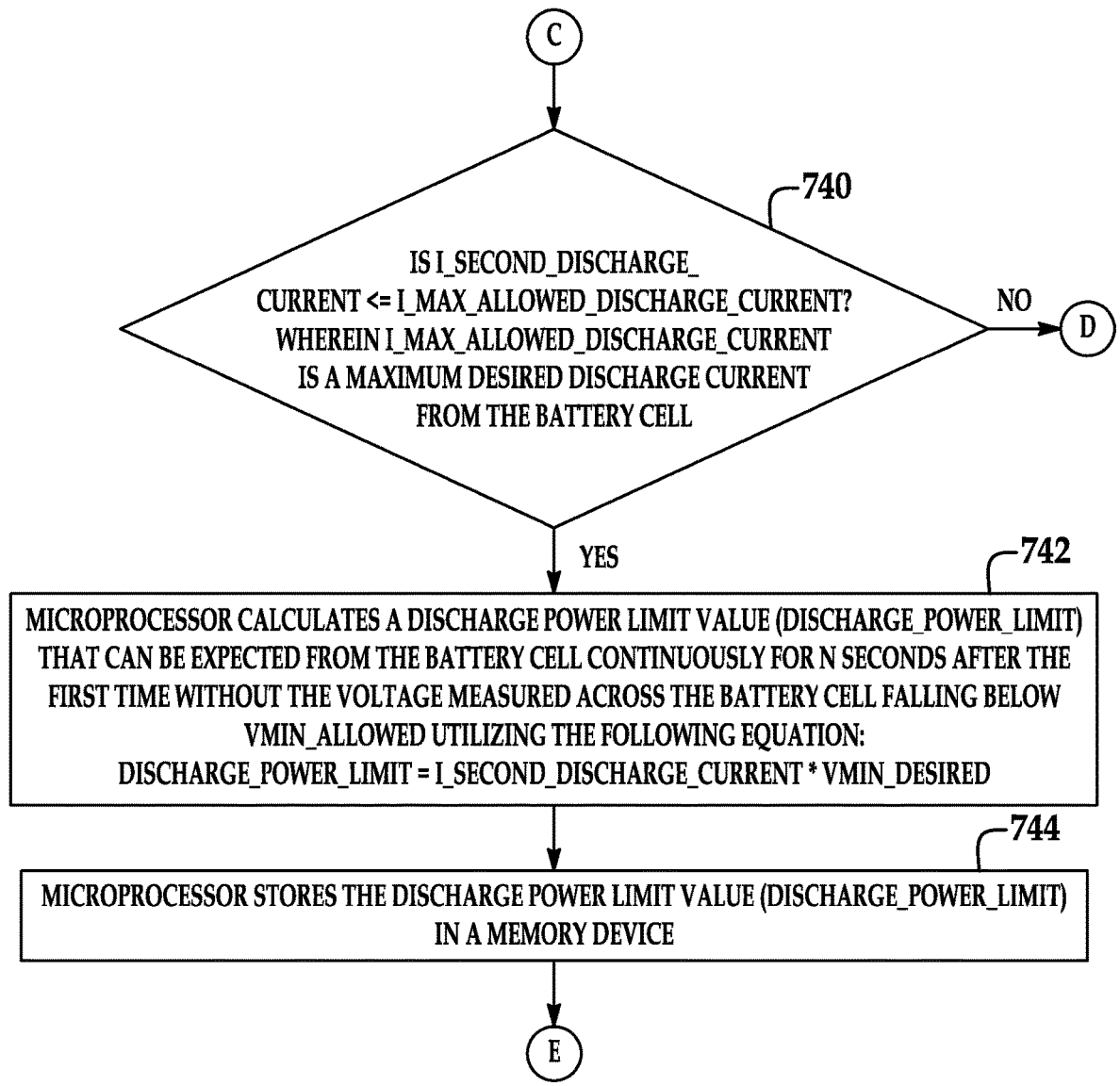
Figure 24:
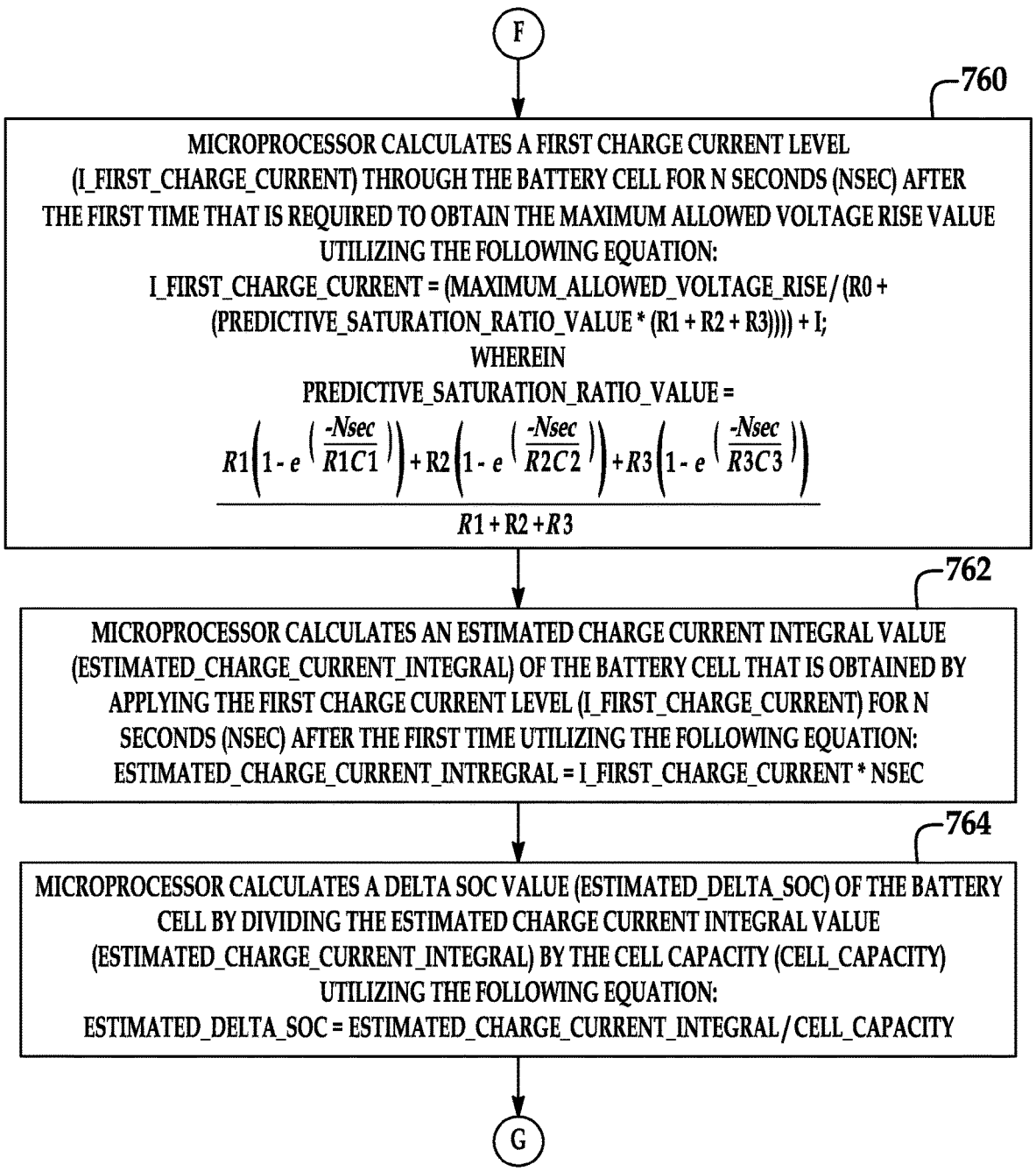
Figure 25:
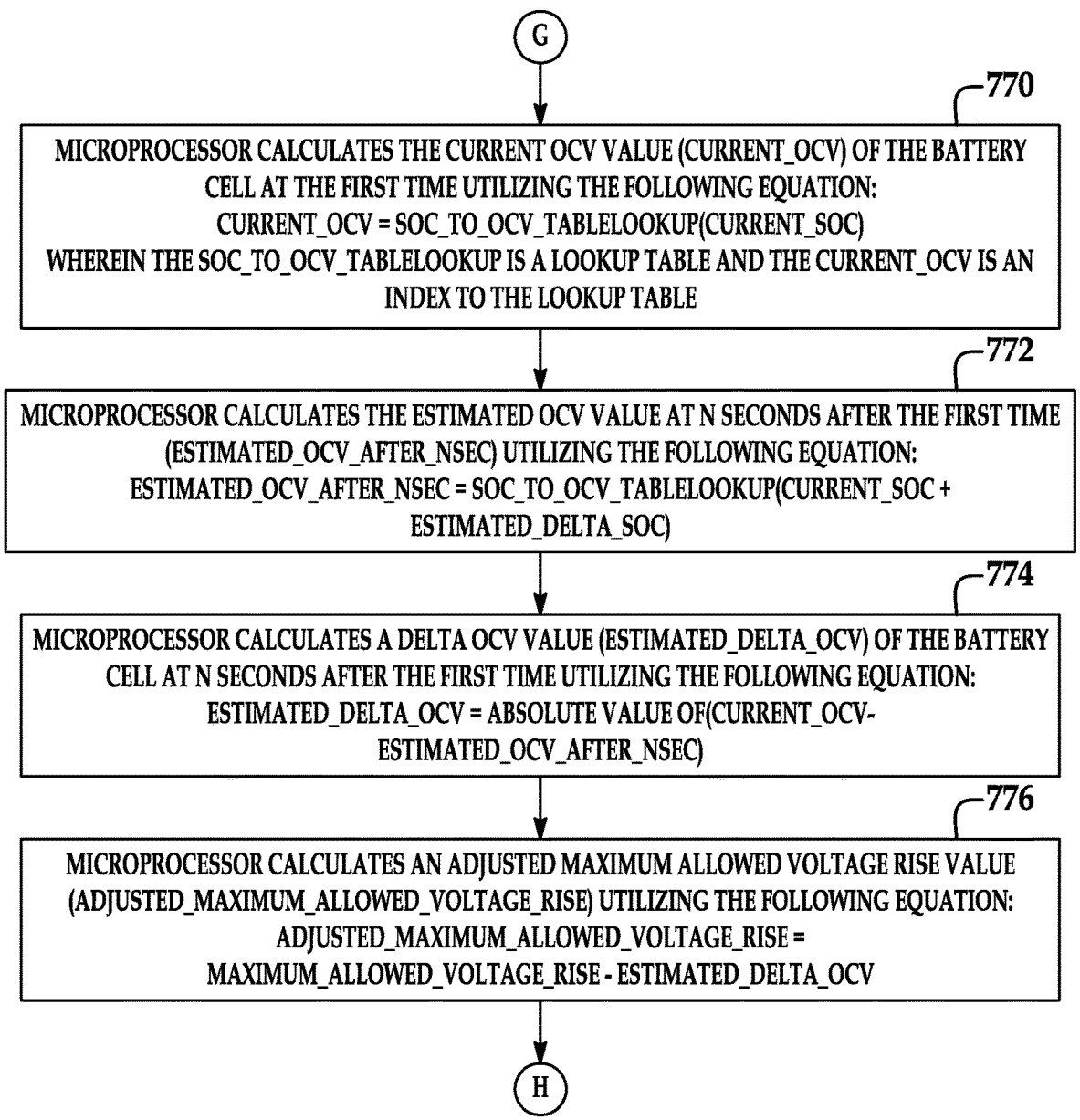
Figure 26:
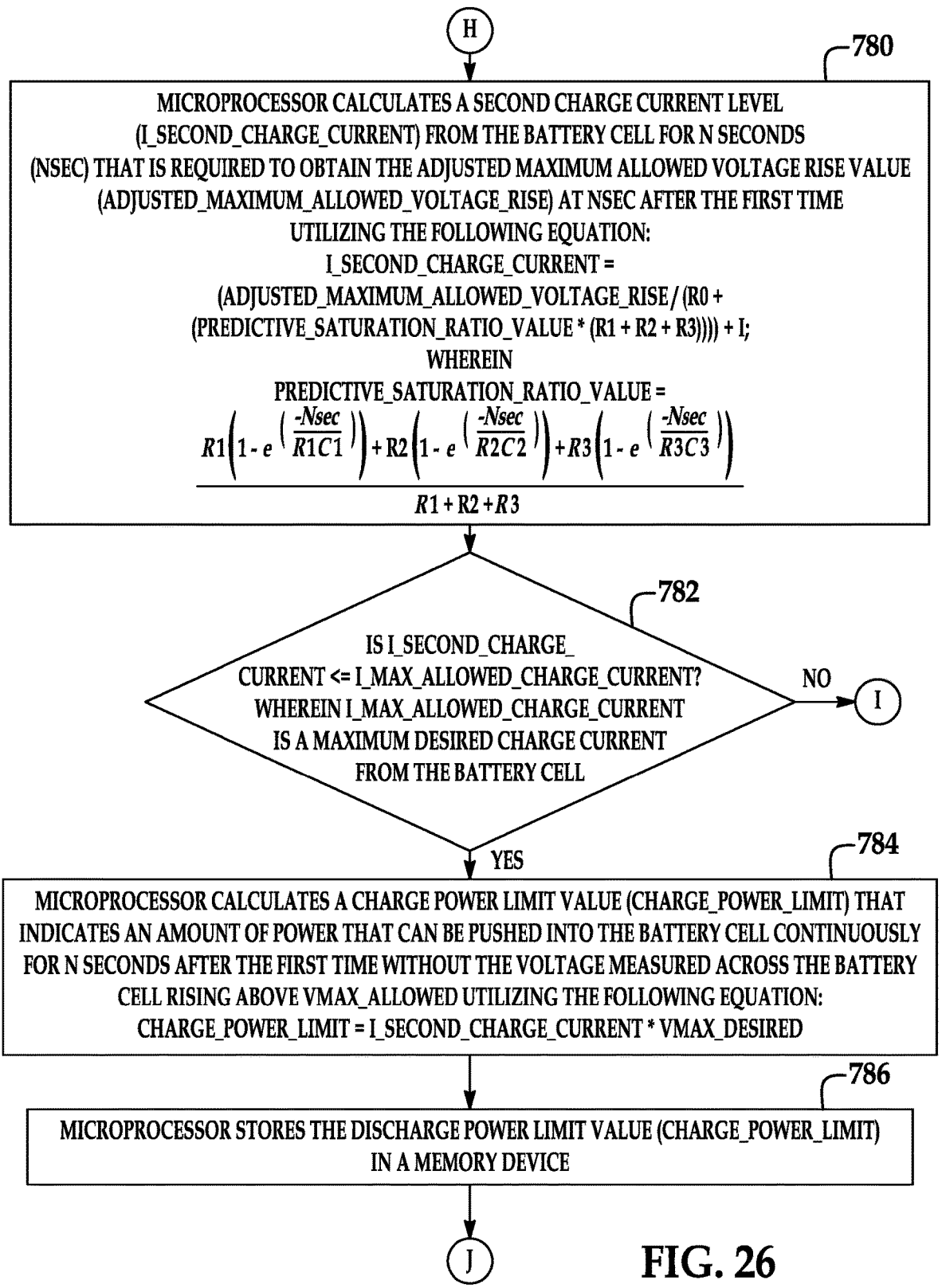
Figure 27:
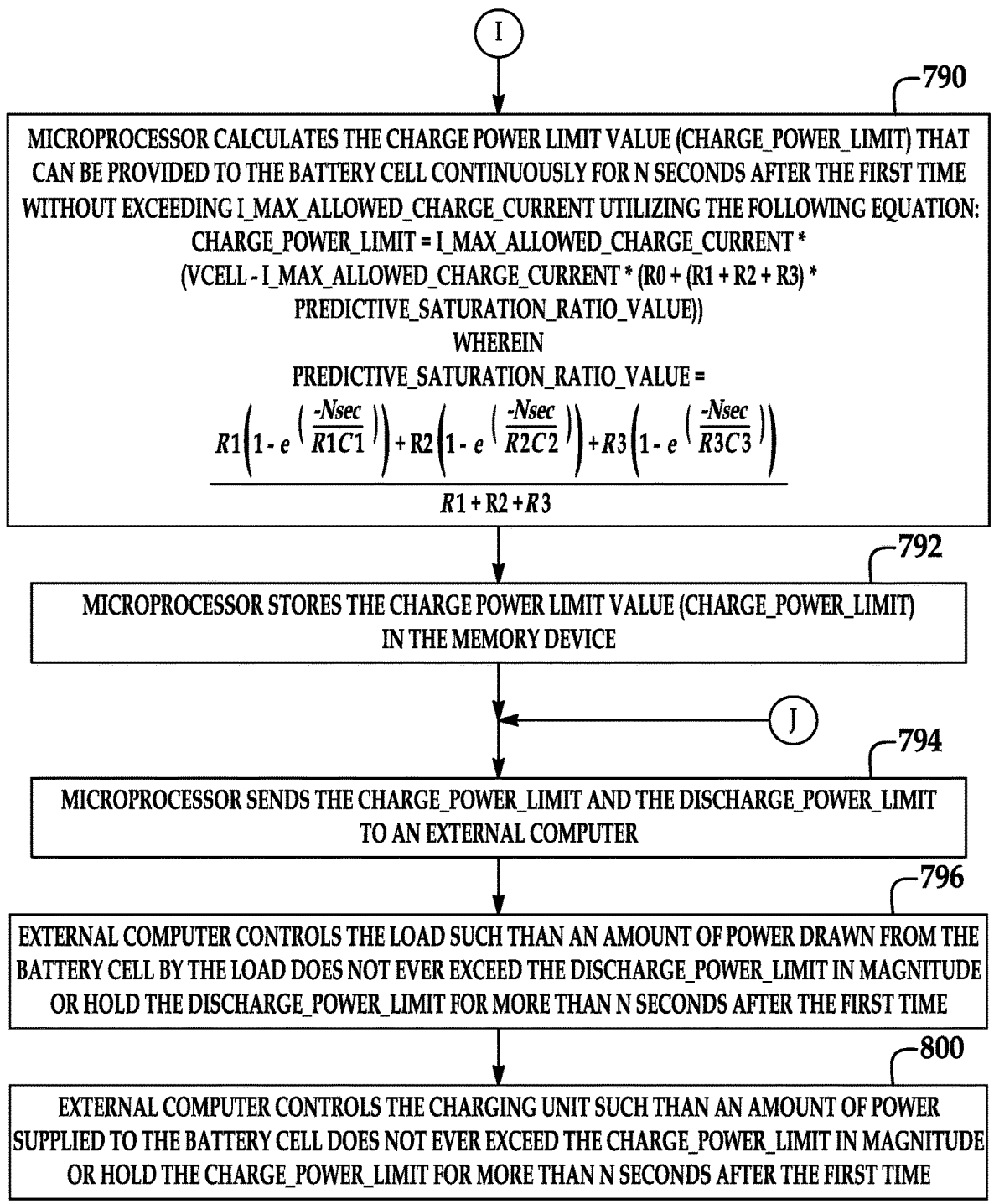

Referring to FIGS. 2 and 3, a brief explanation of a graph 140 illustrating a voltage curve 150 associated with the battery cell 30 will be provided. The voltage curve 150 includes a discharge curve portion 160, a discharge curve portion 162, a relaxation curve portion 164, a charge curve portion 166, and a charge curve portion 168. At time T1, when the battery cell 30 is being discharged, the discharge curve portion 150 illustrates the voltage drop across the resistor 80 of the battery cell 30. From time T1 to T2, as the battery cell continues to be discharged, the capacitance values C1, C2, C3 of the capacitors 91, 92, 93, respectively, and the resistance values R1, R2, R3 of the resistors 81, 82, 83, respectively, dictate the shape of the discharge curve portion 162. At time T2, the battery cell 30 has a saturation state and the capacitors 91, 92, 93 have an open operational state, and the battery cell 30 has an internal resistance corresponding to a sum of the resistance values R0, R1, R2, R3. From time T2 to T3, the battery cell 30 is no longer being discharged, and the relaxation curve portion 164 illustrates the voltage across the battery cell 30 gradually increasing. At time T3, an external charging voltage is applied to the battery cell 30 and the charge curve portion 166 illustrates the voltage gain across the resistor 80 of the battery cell 30. From time T3 to T4, the battery cell 30 is being charged, and capacitance values C1, C2, C3 of the capacitors 91, 92, 93, respectively, and the resistance values R1, R2, R3 of the resistors 81, 82, 83 respectively, dictate the shape of the discharge curve portion 162.

Referring to FIG. 1, the current sensor 32 is electrically coupled in series between the positive terminal of the battery cell 30 and the electrical load 34. The current sensor 32 is adapted to generate a signal having a current value therein that indicates a current level flowing through the battery cell 32, which is received by the microprocessor 42.

The electrical load 34 is electrically coupled between the current sensor 32 and the negative terminal of the battery cell 30. In an exemplary embodiment, the electrical load is an electric motor in which the operation (e.g., speed, torque etc.) of the electric motor is controlled by the external computer 43.

The voltage sensor 36 is electrically coupled in parallel with the electrical load 34. The voltage sensor 36 is adapted to generate a signal having a voltage value therein that indicates a voltage across the battery cell 30, which is received by the microprocessor 42.

The temperature sensor 38 is disposed proximate to the battery cell 30. The temperature sensor 38 is adapted to generate a signal having a cell temperature value therein that indicates a temperature level of the battery cell 30, which is received by the microprocessor 42.

The charging circuit 40 is provided to apply a charging voltage across the battery cell 30 to electrically charge the battery cell 30 in response to a control signal from the microprocessor 42. The charging circuit 40 is electrically coupled between the positive terminal of the battery cell 30 and the negative terminal of the battery cell 30.

The microprocessor 42 is electrically coupled to the current sensor 32, the voltage sensor 36, and the temperature sensor 38. The microprocessor 42 operably communicates with the external computer 43 via a communication bus. The microprocessor 42 includes a memory device 130 for storing data, tables, and software instructions for implementing at least a portion of the methods described hereinafter.

Referring to FIGS. 4-10, a description of the tables stored in the memory device 130 that is utilized by the microprocessor 42 for determining a discharge power limit value of the battery cell 30 for a predetermined amount of time (e.g., 2 seconds) will now be explained.

Referring to FIG. 4, the R0 discharge table 190 has resistance values associated with the resistor 80 in the battery cell equivalent circuit model 60 (shown in FIG. 2), while discharging the battery cell 30. The R0 discharge table 190 utilizes a temperature value of the battery cell 30 and a state-of-charge value of the battery cell 30 as indexes in the table 190 for retrieving resistance values associated with the resistor 80 in the battery cell equivalent circuit model 60 of the battery cell 30. For example, if the battery cell 30 has a temperature value equal to Temp1, and a state-of-charge value equal to SOC2, the microprocessor 42 would extract a resistance value R0_2 from the table 190. It is noted that the resistance values stored in the R0 discharge table 190 are empirically determined before use of the table 190.

Referring to FIG. 5, the R1 discharge table 200 has resistance values associated with the resistor 81 in the battery cell equivalent circuit model 60 (shown in FIG. 2), while discharging the battery cell 30. The R1 discharge table 200 utilizes a temperature value of the battery cell 30 and a state-of-charge value of the battery cell 30 as indexes in the table 200 for retrieving resistance values associated with the resistor 81 in the battery cell equivalent circuit model 60 of the battery cell 30. For example, if the battery cell 30 has a temperature value equal to Temp1, and a state-of-charge value equal to SOC2, the microprocessor 42 would extract a resistance value R1_2 from the table 200. It is noted that the resistance values stored in the R1 discharge table 200 are empirically determined before use of the table 200.

Referring to FIG. 6, the R2 discharge table 210 has resistance values associated with the resistor 82 in the battery cell equivalent circuit model 60 (shown in FIG. 2), while discharging the battery cell 30. The R2 discharge table 210 utilizes a temperature value of the battery cell 30 and a state-of-charge value of the battery cell 30 as indexes in the table 210 for retrieving resistance values associated with the resistor 82 in the battery cell equivalent circuit model 60 of the battery cell 30. For example, if the battery cell 30 has a temperature value equal to Temp1, and a state-of-charge value equal to SOC2, the microprocessor 42 would extract a resistance value R2_2 from the table 210. It is noted that the resistance values stored in the R2 discharge table 210 are empirically determined before use of the table 210.

Referring to FIG. 7, the R3 discharge table 220 has resistance values associated with the resistor 83 in the battery cell equivalent circuit model 60 (shown in FIG. 2), while discharging the battery cell 30. The R3 discharge table 220 utilizes a temperature value of the battery cell 30 and a state-of-charge value of the battery cell 30 as indexes in the table 220 for retrieving resistance values associated with the resistor 83 in the battery cell equivalent circuit model 60 of the battery cell 30. For example, if the battery cell 30 has a temperature value equal to Temp1, and a state-of-charge value equal to SOC2, the microprocessor 42 would extract a resistance value R3_2 from the table 220. It is noted that the resistance values stored in the R3 discharge table 220 are empirically determined before use of the table 220.

Referring to FIG. 8, the R1C1 discharge table 230 has time constant values associated with the parallel combination of the resistor 81 and the capacitor 91 in the battery cell equivalent circuit model 60 (shown in FIG. 2), while discharging the battery cell 30. The R1C1 discharge table 230 utilizes a temperature value of the battery cell 30 and a state-of-charge value of the battery cell 30 as indexes in the table 230 for retrieving time constant values associated with the parallel combination of the resistor 81 and the capacitor 91 in the battery cell equivalent circuit model 60 of the battery cell 30. For example, if the battery cell 30 has a temperature value equal to Temp1, and a state-of-charge value equal to SOC2, the microprocessor 42 would extract a time constant value R1C1_2 from the table 230. It is noted that the time constant values stored in the R1C1 discharge table 230 are empirically determined before use of the table 230.

Referring to FIG. 9, the R2C2 discharge table 240 has time constant values associated with the parallel combination of the resistor 82 and the capacitor 92 in the battery cell equivalent circuit model 60 (shown in FIG. 2), while discharging the battery cell 30. The R2C2 discharge table 240 utilizes a temperature value of the battery cell 30 and a state-of-charge value of the battery cell 30 as indexes in the table 240 for retrieving time constant values associated with the parallel combination of the resistor 82 and the capacitor 92 in the battery cell equivalent circuit model 60 of the battery cell 30. For example, if the battery cell 30 has a temperature value equal to Temp1, and a state-of-charge value equal to SOC2, the microprocessor 42 would extract a time constant value R2C2_2 from the table 240. It is noted that the time constant values stored in the R2C2 discharge table 240 are empirically determined before use of the table 240.

Referring to FIG. 10, the R3C3 discharge table 250 has constant values associated with the parallel combination of the resistor 83 and the capacitor 93 in the battery cell equivalent circuit model 60 (shown in FIG. 2), while discharging the battery cell 30. The R3C3 discharge table 250 utilizes a temperature value of the battery cell 30 and a state-of-charge value of the battery cell 30 as indexes in the table 250 for retrieving time constant values associated with the parallel combination of the resistor 83 and the capacitor 93 in the battery cell equivalent circuit model 60 of the battery cell 30. For example, if the battery cell 30 has a temperature value equal to Temp1, and a state-of-charge value equal to SOC2, the microprocessor 42 would extract a time constant value R3C3_2 from the table 250. It is noted that the time constant values stored in the R3C3 discharge table 250 are empirically determined before use of the table 250.

Referring to FIGS. 11-17, a description of the tables stored in the memory device 130 that is utilized by the microprocessor 42 for determining a charge power limit value of the battery cell 30 for a predetermined amount of time (e.g., 2 seconds) will now be explained. It should be understood that even though the resistance values and time constant values in the tables shown in FIGS. 11-17 may have the same designations as the resistance values and time constant values in the tables shown in the FIGS. 4-10, respectively, the resistance values and time constant values in the charge tables are different than the resistance values and time constant values in the discharge tables. For example, the resistance value R0_2 in the R0 charge table 390 (shown in FIG. 11) would be different than the resistance value R0_2 in the R0 discharge table 190 (shown in FIG. 4).

Referring to FIG. 11, the R0 charge table 390 has resistance values associated with the resistor 80 in the battery cell equivalent circuit model 60 (shown in FIG. 2), while charging the battery cell 30. The R0 charge table 390 utilizes a temperature value of the battery cell 30 and a state-of-charge value of the battery cell 30 as indexes in the table 390 for retrieving resistance values associated with the resistor 80 in the battery cell equivalent circuit model 60 of the battery cell 30. For example, if the battery cell 30 has a temperature value equal to Temp1, and a state-of-charge value equal to SOC2, the microprocessor 42 would extract a resistance value R0_2 from the table 390. It is noted that the resistance values stored in the R0 charge table 390 are empirically determined before use of the table 390.

Referring to FIG. 12, the R1 charge table 400 has resistance values associated with the resistor 81 in the battery cell equivalent circuit model 60 (shown in FIG. 2), while charging the battery cell 30. The R1 charge table 400 utilizes a temperature value of the battery cell 30 and a state-of-charge value of the battery cell 30 as indexes in the table 400 for retrieving resistance values associated with the resistor 81 in the battery cell equivalent circuit model 60 of the battery cell 30. For example, if the battery cell 30 has a temperature value equal to Temp1, and a state-of-charge value equal to SOC2, the microprocessor 42 would extract a resistance value R1_2 from the table 400. It is noted that the resistance values stored in the R1 charge table 400 are empirically determined before use of the table 400.

Referring to FIG. 13, the R2 charge table 410 has resistance values associated with the resistor 82 in the battery cell equivalent circuit model 60 (shown in FIG. 2), while charging the battery cell 30. The R2 charge table 410 utilizes a temperature value of the battery cell 30 and a state-of-charge value of the battery cell 30 as indexes in the table 410 for retrieving resistance values associated with the resistor 82 in the battery cell equivalent circuit model 60 of the battery cell 30. For example, if the battery cell 30 has a temperature value equal to Temp1, and a state-of-charge value equal to SOC2, the microprocessor 42 would extract a resistance value R2_2 from the table 410. It is noted that the resistance values stored in the R2 charge table 410 are empirically determined before use of the table 410.

Referring to FIG. 14, the R3 charge table 420 has resistance values associated with the resistor 83 in the battery cell equivalent circuit model 60 (shown in FIG. 2), while charging the battery cell 30. The R3 charge table 420 utilizes a temperature value of the battery cell 30 and a state-of-charge value of the battery cell 30 as indexes in the table 420 for retrieving resistance values associated with the resistor 83 in the battery cell equivalent circuit model 60 of the battery cell 30. For example, if the battery cell 30 has a temperature value equal to Temp1, and a state-of-charge value equal to SOC2, the microprocessor 42 would extract a resistance value R3_2 from the table 420. It is noted that the resistance values stored in the R3 charge table 420 are empirically determined before use of the table 420.

Referring to FIG. 15, the R1C1 charge table 430 has time constant values associated with the parallel combination of the resistor 81 and the capacitor 91 in the battery cell equivalent circuit model 60 (shown in FIG. 2), while charging the battery cell 30. The R1C1 charge table 430 utilizes a temperature value of the battery cell 30 and a state-of-charge value of the battery cell 30 as indexes in the table 430 for retrieving time constant values associated with the parallel combination of the resistor 81 and the capacitor 91 in the battery cell equivalent circuit model 60 of the battery cell 30. For example, if the battery cell 30 has a temperature value equal to Temp1, and a state-of-charge value equal to SOC2, the microprocessor 42 would extract a time constant value R1C1_2 from the table 430. It is noted that the time constant values stored in the R1C1 charge table 430 are empirically determined before use of the table 430.

Referring to FIG. 16, the R2C2 charge table 440 has time constant values associated with the parallel combination of the resistor 82 and the capacitor 92 in the battery cell equivalent circuit model 60 (shown in FIG. 2), while charging the battery cell 30. The R2C2 charge table 440 utilizes a temperature value of the battery cell 30 and a state-of-charge value of the battery cell 30 as indexes in the table 440 for retrieving time constant values associated with the parallel combination of the resistor 82 and the capacitor 92 in the battery cell equivalent circuit model 60 of the battery cell 30. For example, if the battery cell 30 has a temperature value equal to Temp1, and a state-of-charge value equal to SOC2, the microprocessor 42 would extract a time constant value R2C2_2 from the table 440. It is noted that the time constant values stored in the R2C2 charge table 440 are empirically determined before use of the table 440.

Referring to FIG. 17, the R3C3 charge table 450 has time constant values associated with the parallel combination of the resistor 83 and the capacitor 93 in the battery cell equivalent circuit model 60 (shown in FIG. 2), while charging the battery cell 30. The R3C3 charge table 450 utilizes a temperature value of the battery cell 30 and a state-of-charge value of the battery cell 30 as indexes in the table 450 for retrieving time constant values associated with the parallel combination of the resistor 83 and the capacitor 93 in the battery cell equivalent circuit model 60 of the battery cell 30. For example, if the battery cell 30 has a temperature value equal to Temp1, and a state-of-charge value equal to SOC2, the microprocessor 42 would extract a time constant value R3C3_2 from the table 450. It is noted that the time constant values stored in the R3C3 charge table 450 are empirically determined before use of the table 450.

Referring to FIG. 18, the SOC_TO_OCV_TABLELOOKUP table 500 has SOC values and OCV values associated with the battery cell 30. The table 500 uses an SOC value as an index to the table 500 for retrieving and associated OCV value. For example, if the battery cell 30 has a SOC value equal to SOC1, the microprocessor 42 would extract an OCV value OCV1 from the table 500. It is noted that the SOC values and the OCV values in the table 500 are empirically determined before use of the table 500.

Referring to FIGS. 1, 2 and 18-27, a flowchart of a method for determining a discharge power limit value and a charge power limit value of a battery cell 30 in accordance with another exemplary embodiment will now be described.

At step 700, the current sensor 32 generates a first signal having a current value (I) therein. The current value (I) indicates a current level flowing through the battery cell 30 at a first time. After step 700, the method advances to step 702.

At step 702, the microprocessor 42 receives the first signal having the current value (I) therein. After step 702, the method advances to step 704.

At step 704, the voltage sensor 36 generates a second signal having the voltage value (VCELL) therein. The voltage value (VCELL) indicates a voltage measured across the battery cell 30 at the first time. After step 704, the method advances to step 706.

At step 706, the microprocessor 42 receives the second signal having the voltage value (VCELL) therein. After step 706, the method advances to step 708.

At step 708, the temperature sensor 38 generates a third signal having the cell temperature value (TEMP) therein. The cell temperature value (TEMP) indicates a temperature level of the battery cell 30 at the first time. After step 708, the method advances to step 710.

At step 710, the microprocessor 42 receives the third signal having the temperature value (TEMP) therein.

At step 712, the microprocessor 42 calculates a current state-of-charge value (CURRENT_SOC) of the battery cell 30 utilizing the following equation: CURRENT_SOC=f (previous SOC, VCELL, I, TEMP, TIME) wherein f corresponds to a function adapted to calculate the state-of-charge value. After step 712, the method advances to step 714.

At step 714, the microprocessor 42 calculates a maximum allowed voltage drop value (MAXIMUM_ALLOWED_VOLTAGE_DROP) corresponding to a difference between a voltage measured across the battery cell 30 at the first time (VCELL) and a minimum allowed voltage measured across the battery cell 30 (VMIN_ALLOWED) at any time utilizing the following equation: MAXIMUM_ALLOWED_VOLTAGE_DROP=VCELL−VMIN_ALLOWED.

After step 714, the method advances to step 720.

At step 720, the microprocessor 42 calculates a first discharge current level (I_FIRST_DISCHARGE_CURRENT) from the battery cell 30 for N seconds (NSEC) after the first time that is required to obtain the maximum allowed voltage drop value utilizing the following equation: I_FIRST_DISCHARGE_CURRENT=(MAXIMUM_ALLOWED_VOLTAGE_DROP/(R0+(PREDICTIVE_SATURATION_RATIO_VALUE*(R1+R2+R3))))+I; wherein $$\text{PREDICTIVE\_SATURATION\_RATIO\_VALUE} = \frac{R1\left(1 - e^{\left(\frac{-Nsec}{R1C1}\right)}\right) + R2\left(1 - e^{\left(\frac{-NSec}{R2C2}\right)}\right) + R3\left(1 - e^{\left(\frac{-NSec}{R3C3}\right)}\right)}{R1 + R2 + R3}$$

After step 720, the method advances to step 722.

At step 722, the microprocessor 42 calculates an estimated discharge current integral value (ESTIMATED DISCHARGE CURRENT INTEGRAL) of the battery cell 30 that is obtained by applying the first discharge current level (I_FIRST_DISCHARGE_CURRENT) for N seconds (NSEC) after the first time utilizing the following equation: ESTIMATED_DISCHARGE_CURRENT_INTEGRAL= I_FIRST_DISCHARGE_CURRENT*NSEC.

After step 722, method advances to step 724.

At step 724, the microprocessor 42 calculates an estimated delta SOC value (ESTIMATED_DELTA_SOC) of the battery cell 30 by dividing the estimated discharge current integral value (ESTIMATED_DISCHARGE_CURRENT_INTEGRAL) by the cell capacity (CELL_CAPACITY) utilizing the following equation: ESTIMATED_DELTA_SOC=ESTIMATED_DISCHARGE_CURRENT_INTEGRAL/CELL_CAPACITY.

After step 724, the method advances to step 726.

At step 726, the microprocessor 42 calculates the current OCV value (CURRENT_OCV) of the battery cell 30 at the first time utilizing the following equation: CURRENT_OCV=SOC_TO_OCV_TABLELOOKUP (CURRENT_SOC), wherein the SOC_TO_OCV_TABLELOOKUP is a lookup table and the CURRENT_OCV is an index to the lookup table. After step 726, the method advances to step 730.

At step 730, the microprocessor 42 calculates the estimated OCV value at N seconds after the first time (ESTIMATED_OCV_AFTER_NSEC) utilizing the following equation: ESTIMATED_OCV_AFTER_NSEC=SOC_TO_OCV_TABLELOOKUP(CURRENT_SOC+ESTIMATED_DELTA_SOC).

After step 730, the method advances to step 732.

At step 732, the microprocessor 42 calculates a delta OCV value (ESTIMATED_DELTA_OCV) of the battery cell 30 at N seconds after the first time utilizing the following equation: ESTIMATED_DELTA_OCV=ABSOLUTE VALUE OF(CURRENT_OCV−ESTIMATED_OCV_AFTER_NSEC).

After step 732, the method advances to step 734.

At step 734, the microprocessor 42 calculates an adjusted maximum allowed voltage drop value (ADJUSTED_MAXIMUM_ALLOWED_VOLTAGE_DROP) utilizing the following equation: ADJUSTED_MAXIMUM_ALLOWED_VOLTAGE_DROP=MAXIMUM_ALLOWED_VOLTAGE_DROP−ESTIMATED_DELTA_OCV.

After step 734, the method advances to step 736.

At step 736, the microprocessor 42 calculates a second discharge current level (I_SECOND_DISCHARGE_CURRENT) from the battery cell 30 for N seconds (NSEC) that is required to obtain the adjusted maximum allowed voltage drop value (ADJUSTED_MAXIMUM_ALLOWED_VOLTAGE_DROP) at NSEC after the first time utilizing the following equation: I_SECOND_DISCHARGE_CURRENT=(ADJUSTED_MAXIMUM_ALLOWED_VOLTAGE_DROP/(R0+(PREDICTIVE_SATURATION_RATIO_VALUE*(R1+R2+R3))))+I; wherein $$\text{PREDICTIVE\_SATURATION\_RATIO\_VALUE} = \frac{R1\left(1 - e^{\left(\frac{-Nsec}{R1C1}\right)}\right) + R2\left(1 - e^{\left(\frac{-NSec}{R2C2}\right)}\right) + R3\left(1 - e^{\left(\frac{-NSec}{R3C3}\right)}\right)}{R1 + R2 + R3}$$

After step 736, the method advances to step 740.

At step 740, the microprocessor 42 makes a determination as to whether the I_SECOND_DISCHARGE_CURRENT is less than or equal to I_MAX_ALLOWED_DISCHARGE_CURRENT, wherein I_MAX_ALLOWED_DISCHARGE_CURRENT is a maximum desired discharge current from the battery cell 30. If the value of step 740 equals "yes", the method advances to step 742. Otherwise, the method advances to step 750.

At step 742, the microprocessor 42 calculates a discharge power limit value (DISCHARGE_POWER_LIMIT) that can be expected from the battery cell 30 continuously for N seconds after the first time without the voltage measured across the battery cell 30 falling below VMIN_ALLOWED utilizing the following equation: DISCHARGE_POWER_LIMIT=I_SECOND_DISCHARGE_CURRENT*VMIN_DESIRED.

After step 742, the method advances to step 744.

At step 744, the microprocessor 42 stores the discharge power limit value (DISCHARGE_POWER_LIMIT) in a memory device 130. After step 744, the method advances to step 754.

Referring again to step 740, if the value of step 740 equals "no", the method advances to step 750. At step 750, the microprocessor 42 calculates the discharge power limit value (DISCHARGE_POWER_LIMIT) that indicates an amount of power that can be expected from the battery cell 30 continuously for N seconds after the first time without exceeding I_MAX_ALLOWED_DISCHARGE_CURRENT utilizing the following equation: DISCHARGE_POWER_LIMIT=I_MAX_ALLOWED_DISCHARGE_CURRENT*(VCELL−I_MAX_ALLOWED_DISCHARGE_CURRENT*(R0+(R1+R2+R3)*PREDICTIVE_SATURATION_RATIO_VALUE)), wherein

PREDICTIVE_SATURATION_RATIO_VALUE =

$$\frac{R1(1 - e^{(\frac{-Nsec}{R1C1})}) + R2(1 - e^{(\frac{-NSec}{R2C2})}) + R3(1 - e^{(\frac{-NSec}{R3C3})})}{R1 + R2 + R3}$$

After step 750, the method advances to step 752.

At step 752, the microprocessor 42 stores the discharge power limit value (DISCHARGE_POWER_LIMIT) in the memory device 130. After step 752, the method advances to step 754.

At step 754, the microprocessor 42 calculates a maximum allowed voltage rise value (MAXIMUM_ALLOWED_VOLTAGE_RISE) corresponding to a difference between a voltage measured across the battery cell 30 at the first time (VCELL) and a maximum allowed voltage measured across the battery cell 30 (VMAX_ALLOWED) at any time utilizing the following equation: MAXIMUM_ALLOWED_VOLTAGE_RISE=VMAX_ALLOWED−VCELL.

After step 754, the method advances to step 760.

At step 760, the microprocessor 42 calculates a first charge current level (I_FIRST_CHARGE_CURRENT) through the battery cell 30 for N seconds (NSEC) after the first time that is required to obtain the maximum allowed voltage rise value utilizing the following equation: I_FIRST_CHARGE_CURRENT=(MAXIMUM_ALLOWED_VOLTAGE_RISE/(R0+(PREDICTIVE_SATURATION_RATIO_VALUE*(R1+R2+R3))))+I; wherein

PREDICTIVE_SATURATION_RATIO_VALUE =

$$\frac{R1(1 - e^{(\frac{-Nsec}{R1C1})}) + R2(1 - e^{(\frac{-NSec}{R2C2})}) + R3(1 - e^{(\frac{-NSec}{R3C3})})}{R1 + R2 + R3}$$

After step 760, the method advances to step 762.

At step 762, the microprocessor 42 calculates an estimated charge current integral value (ESTIMATED_CHARGE_CURRENT_INTEGRAL) of the battery cell 30 that is obtained by applying the first charge current level (I_FIRST_CHARGE_CURRENT) for N seconds (NSEC) after the first time utilizing the following equation: ESTIMATED_CHARGE_CURRENT_INTEGRAL=I_FIRST_CHARGE_CURRENT*NSEC.

After step 762, the method advances to step 764.

At step 764, the microprocessor 42 calculates a delta SOC value (ESTIMATED_DELTA_SOC) of the battery cell 30 by dividing the estimated charge current integral value (ESTIMATED_CHARGE_CURRENT_INTEGRAL) by the cell capacity (CELL_CAPACITY) utilizing the following equation: ESTIMATED_DELTA_SOC=ESTIMATED_CHARGE_CURRENT_INTEGRAL/CELL_CAPACITY.

After step 764, the method advances to step 770.

At step 770, the microprocessor 42 calculates the current OCV value (CURRENT_OCV) of the battery cell 30 at the first time utilizing the following equation: CURRENT_OCV=SOC_TO_OCV_TABLELOOKUP(CURRENT_SOC), wherein the SOC_TO_OCV_TABLELOOKUP is a lookup table and the CURRENT_OCV is an index to the lookup table. After step 770, the method advances to step 772.

At step 772, the microprocessor 42 calculates the estimated OCV value at N seconds after the first time (ESTIMATED_OCV_AFTER_NSEC) utilizing the following equation: ESTIMATED_OCV_AFTER_NSEC=SOC_TO_OCV_TABLELOOKUP(CURRENT_SOC+ESTIMATED_DELTA_SOC).

After step 772, the method advances to step 774.

At step 774, the microprocessor 42 calculates a delta OCV value (ESTIMATED_DELTA_OCV) of the battery cell 30 at N seconds after the first time utilizing the following equation: ESTIMATED_DELTA_OCV=ABSOLUTE VALUE OF(CURRENT_OCV−ESTIMATED_OCV_AFTER_NSEC).

After step 774, the method advances to step 776.

At step 776, the microprocessor 42 calculates an adjusted maximum allowed voltage rise value (ADJUSTED_MAXIMUM_ALLOWED_VOLTAGE_RISE) utilizing the following equation: ADJUSTED_MAXIMUM_ALLOWED_VOLTAGE_RISE=MAXIMUM_ALLOWED_VOLTAGE_RISE−ESTIMATED_DELTA_OCV.

After step 776, the method advances to step 780.

At step 780, the microprocessor 42 calculates a second charge current level (I_SECOND_CHARGE_CURRENT) from the battery cell 30 for N seconds (NSEC) that is required to obtain the adjusted maximum allowed voltage rise value (ADJUSTED_MAXIMUM_ALLOWED_VOLTAGE_RISE) at NSEC after the first time, utilizing the following equation: I_SECOND_CHARGE_CURRENT=(ADJUSTED_MAXIMUM_ALLOWED_VOLTAGE_RISE/(R0+(PREDICTIVE_SATURATION_RATIO_VALUE*(R1+R2+R3))))+I; wherein

PREDICTIVE_SATURATION_RATIO_VALUE =

$$\frac{R1(1 - e^{(\frac{-Nsec}{R1C1})}) + R2(1 - e^{(\frac{-NSec}{R2C2})}) + R3(1 - e^{(\frac{-NSec}{R3C3})})}{R1 + R2 + R3}$$

After step 780, the method advances to step 782.

At step 782, the microprocessor 42 makes a determination as to whether the I_SECOND_CHARGE_CURRENT is less than or equal to I_MAX_ALLOWED_CHARGE_CURRENT, wherein I_MAX_ALLOWED_CHARGE_CURRENT is a maximum desired charge current from the battery cell 30. If the value of step 782 equals "yes", the method advances to step 784. Otherwise, the method advances to step 790.

At step 784, the microprocessor 42 calculates a charge power limit value (CHARGE_POWER_LIMIT) that indicates an amount of power that can be pushed into the battery cell 30 continuously for N seconds after the first time without the voltage measured across the battery cell 30 rising above VMAX_ALLOWED utilizing the following equation: CHARGE_POWER_LIMIT=I_SECOND_ CHARGE_CURRENT*VMAX_DESIRED.

After step 784, the method advances to step 786.

At step 786, the microprocessor 42 stores the discharge power limit value (CHARGE_POWER_LIMIT) in a memory device 130. After step 786, the method advances to step 794.

Referring again to step 782, if the value of step 782 equals "no", the method advances to step 790. At step 790, the microprocessor 42 calculates the charge power limit value (CHARGE_POWER_LIMIT) that can be provided to the battery cell 30 continuously for N seconds after the first time without exceeding I_MAX_ALLOWED_CHARGE_CURRENT utilizing the following equation: CHARGE_ POWER_LIMIT=I_MAX_ALLOWED_CHARGE_ CURRENT*(VCELL−I_MAX_ALLOWED_CHARGE_ CURRENT*(R0+(R1+R2+R3)*PREDICTIVE_SATURATION_RATIO_VALUE)), wherein $$\text{PREDICTIVE\_SATURATION\_RATIO\_VALUE} = \frac{R1\left(1 - e^{\left(\frac{-NSec}{R1C1}\right)}\right) + R2\left(1 - e^{\left(\frac{-NSec}{R2C2}\right)}\right) + R3\left(1 - e^{\left(\frac{-NSec}{R3C3}\right)}\right)}{R1 + R2 + R3}$$

After step 790, the method advances to step 792.

At step 792, the microprocessor 42 stores the charge power limit value (CHARGE_POWER_LIMIT) in the memory device 130. After step 792, the method advances to step 794.

At step 794, the microprocessor 42 sends the CHARGE_ POWER_LIMIT and the DISCHARGE_POWER_LIMIT to an external computer 43. After step 794, the method advances to step 796.

At step 796, the external computer 43 controls the load 34 such than an amount of power drawn from the battery cell 30 by the load 34 does not ever exceed the DISCHARGE_ POWER_LIMIT in magnitude or hold the DISCHARGE_ POWER_LIMIT for more than N seconds after the first time. After step 796, the method advances to step 800.

At step 800, the external computer 43 controls the charging unit 40 such than an amount of power supplied to the battery cell 30 does not ever exceed the CHARGE POWER Limn in magnitude or hold the CHARGE_POWER_LIMIT for more than N seconds after the first time.

The above-described method can be at least partially embodied in the form of one or more memory devices or computer readable media having computer-executable instructions for practicing the methods. The memory devices can comprise one or more of the following: hard drives, RAM memory, flash memory, and other computer-readable media known to those skilled in the art; wherein, when the computer-executable instructions are loaded into and executed by one or more microprocessors or computers, the one or more microprocessors or computers become an apparatus programmed to practice the associated steps of the method.

The system 10 described herein provide a substantial advantage over other systems. In particular, the system 10 has a technical effect of determining a change in the OCV (e.g., delta OCV value) in the battery cell 30 to determine a discharge power limit value that indicates an amount of power that is expected from the battery cell 30 continuously for N seconds after a first time without the voltage measured across the battery cell 30 falling below a minimum allowed voltage of the battery cell 30. Further, the system 10 determines a change in the OCV in the battery cell 30 to determine a charge power limit value that indicates an amount of power that is pushed into the battery cell continuously for N seconds after the first time without the voltage measured across the battery cell 30 exceeding the maximum allowed voltage of the battery cell 30.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for determining a discharge power limit value of a battery cell, comprising:
   a current sensor generating a first signal having a first current value therein indicating a current level flowing through the battery cell at a first time;
   a microprocessor calculating a maximum allowed voltage drop value corresponding to a difference between a voltage measured across the battery cell at the first time and a minimum allowed voltage of the battery cell;
   the microprocessor calculating a first discharge current level through the battery cell for N seconds after the first time to obtain the maximum allowed voltage drop value, based on the first current value;
   the microprocessor calculating an adjusted maximum allowed voltage drop value based on the maximum allowed voltage drop value, and an estimated delta OCV value at N seconds after the first time; the estimated delta OCV value being calculated based on the first discharge current level;
   the microprocessor calculating a second discharge current level through the battery cell for N seconds after the first time to obtain the adjusted maximum allowed voltage drop value; and
   the microprocessor calculating a discharge power limit value based on the second discharge current level, if the second discharge current level is less than or equal to a maximum allowed discharge current.

2. The system of claim 1, wherein the discharge power limit value indicates an amount of power that is expected from the battery cell continuously for N seconds after the first time without the voltage measured across the battery cell falling below the minimum allowed voltage of the battery cell.

3. The system of claim 2, wherein:
   the microprocessor calculating the discharge power limit value based on a maximum allowed discharge current, that indicates an amount of power that is expected from the battery cell continuously for N seconds after the first time without the current level flowing through the battery cell being greater than the maximum allowed discharge current level, if the second discharge current level is greater than the maximum allowed discharge current level.

4. The system of claim 2, wherein:
the microprocessor calculating the adjusted maximum allowed voltage drop value utilizing a following equation:

adjusted maximum allowed voltage drop value=maximum allowed voltage drop value−estimated delta OCV value.

5. The system of claim 2, wherein:
the microprocessor calculating an estimated discharge current integral value that is obtained by applying the first discharge current level for N seconds after the first time;
the microprocessor calculating an estimated delta SOC value at N seconds after the first time based on the estimated discharge current integral value; and
the microprocessor calculating the estimated OCV value at N seconds after the first time based on a current SOC value at the first time and the estimated delta SOC value; and
the microprocessor calculating the estimated delta OCV value based on the estimated OCV value at N seconds after the first time and a current OCV value.

6. The system of claim 5, wherein:
the microprocessor calculating the estimated discharge current integral value utilizing a following equation:

estimated discharge current integral value=first discharge current level*$N$ seconds.

7. The system of claim 5, wherein:
the microprocessor calculating the estimated delta SOC value utilizing a following equation:

estimated delta SOC value=estimated discharge current integral value/cell capacity.

8. The system of claim 5, wherein:
the microprocessor calculating the estimated OCV value at N seconds after the first time in a lookup table utilizing an index, the index being a sum of the estimated delta SOC value and the current SOC value.

9. The system of claim 5, wherein:
the microprocessor calculating the estimated delta OCV value at N seconds after the first time utilizing the following equation:

estimated delta OCV=absolute value of(current OCV value−estimated OCV value at $N$ seconds after the first time).

10. The system of claim 1, wherein:
the microprocessor calculating the first discharge current level through the battery cell for N seconds after the first time to obtain the maximum allowed voltage drop value, further based on a first ohmic resistance value, at least a first time-varying resistance value, and a first predictive saturation ratio value of a battery circuit model.

11. A system for determining a charge power limit value of a battery cell, comprising:
a current sensor generating a first signal having a first current value therein indicating a current level flowing through the battery cell at a first time;
a microprocessor calculating a maximum allowed voltage rise value corresponding to a difference between a voltage measured across the battery cell at the first time and a maximum allowed voltage of the battery cell;
the microprocessor calculating a first charge current level through the battery cell for N seconds after the first time to obtain the maximum allowed voltage rise value, based on the first current value;
the microprocessor calculating an adjusted maximum allowed voltage rise value based on the maximum allowed voltage rise value, and an estimated delta OCV value at N seconds after the first time; the estimated delta OCV value being calculated based on the first charge current level;
the microprocessor calculating a second charge current level through the battery cell for N seconds after the first time to obtain the adjusted maximum allowed voltage rise value; and
the microprocessor calculating a charge power limit value based on the second charge current level, if the second charge current level is less than or equal to a maximum allowed charge current.

12. The system of claim 11, wherein the charge power limit value indicates an amount of power that is pushed into the battery cell continuously for N seconds after the first time without the voltage measured across the battery cell exceeding the maximum allowed voltage of the battery cell.

13. The system of claim 12, wherein:
the microprocessor calculating the charge power limit value based on a maximum allowed charge current, that indicates an amount of power that is pushed into the battery cell continuously for N seconds after the first time without the current level flowing through the battery cell being greater than the maximum allowed charge current level, if the second charge current level is greater than the maximum allowed charge current level.

14. The system of claim 12, wherein:
the microprocessor calculating the adjusted maximum allowed voltage rise value utilizing a following equation:

adjusted maximum allowed voltage rise value=maximum allowed voltage rise value−estimated delta OCV value.

15. The system of claim 12, wherein:
the microprocessor calculating an estimated charge current integral value that is obtained by applying the first charge current level for N seconds after the first time;
the microprocessor calculating an estimated delta SOC value at N seconds after the first time based on the estimated charge current integral value; and
the microprocessor calculating the estimated OCV value at N seconds after the first time based on a current SOC value at the first time and the estimated delta SOC value; and
the microprocessor calculating the estimated delta OCV value based on the estimated OCV value at N seconds after the first time and a current OCV value.

16. The system of claim 15, wherein:
the microprocessor calculating the estimated charge current integral value utilizing a following equation:

estimated charge current integral value=first charge current level*$N$ seconds.

17. The system of claim 15, wherein:
the microprocessor calculating the estimated delta SOC value utilizing a following equation:

estimated delta SOC value=estimated charge current integral value/cell capacity.

18. The system of claim 15, wherein:
the microprocessor calculating the estimated OCV value at N seconds after the first time in a lookup table utilizing an index, the index being a sum of the estimated delta SOC value and the current SOC value.

19. The system of claim 15, wherein:
the microprocessor calculating the estimated delta OCV value at N seconds after the first time utilizing the following equation:

estimated delta OCV=absolute value of(current OCV value−estimated OCV value at $N$ seconds after the first time).

20. The system of claim 11, wherein:
the microprocessor calculating the first discharge current level through the battery cell for N seconds after the first time to obtain the maximum allowed voltage drop value, further based on a first ohmic resistance value, at least a first time-varying resistance value, and a first predictive saturation ratio value of a battery circuit model.

* * * * *